US009470530B2

(12) United States Patent
Thomas

(10) Patent No.: US 9,470,530 B2
(45) Date of Patent: Oct. 18, 2016

(54) ELECTRONIC DEVICE COMPRISING A MOULDED INTERCONNECT DEVICE

(71) Applicant: Atlantic Inertial Systems Limited, Plymouth (GB)

(72) Inventor: Henry Thomas, Plymouth (GB)

(73) Assignee: ATLANTIC INERTIAL SYSTEMS LIMITED, Plymouth (GB)

( * ) Notice: Subject to any disclaimer, the term of this patent is extended or adjusted under 35 U.S.C. 154(b) by 0 days.

(21) Appl. No.: 14/362,214

(22) PCT Filed: Nov. 29, 2012

(86) PCT No.: PCT/GB2012/052944
§ 371 (c)(1),
(2) Date: Jun. 2, 2014

(87) PCT Pub. No.: WO2013/083959
PCT Pub. Date: Jun. 13, 2013

(65) Prior Publication Data
US 2014/0336930 A1    Nov. 13, 2014

(30) Foreign Application Priority Data
Dec. 7, 2011   (GB) .................................. 1120981.4

(51) Int. Cl.
H01R 12/00    (2006.01)
G01C 21/16    (2006.01)
G01S 19/35    (2010.01)
H05K 1/14    (2006.01)
(Continued)

(52) U.S. Cl.
CPC ............. *G01C 21/165* (2013.01); *G01S 19/13* (2013.01); *G01S 19/35* (2013.01); *H05K 1/119* (2013.01); *H05K 1/144* (2013.01); *H05K 7/10* (2013.01); *H05K 2203/167* (2013.01)

(58) Field of Classification Search
CPC ...................................................... H01R 12/714
USPC ....................................... 439/74, 931, 68, 71
See application file for complete search history.

(56) References Cited

U.S. PATENT DOCUMENTS 3,605,075 A * 9/1971 Stofkooper .......... H05K 7/1007
439/331
4,718,854 A   1/1988 Capp et al.
(Continued)

FOREIGN PATENT DOCUMENTS

GB   2274356      7/1994
WO   0231921       4/2002
WO   2010039904   4/2010

OTHER PUBLICATIONS

International Search Report and Written Opinion dated Mar. 21, 2013 in PCT/GB2012/052944.
(Continued)

*Primary Examiner* — Neil Abrams
(74) *Attorney, Agent, or Firm* — Snell & Wilmer, LLP.

(57) ABSTRACT

An electronic device comprises a circuit substrate (5), and a moulded interconnect device (4) incorporating integral legs (8) to mount the interconnect device upon the substrate, the legs spacing at least one of the legs carrying a conducting track (20, 21, 22) to provide an electrical interconnection between the interconnect device and the substrate. The substrate (5) may comprise another moulded interconnect device and may be mounted upon a processor (3) and may include an electromagnetic shield (30) on its lower surface.

7 Claims, 4 Drawing Sheets

(51) Int. Cl.
*H05K 1/11* (2006.01)
*G01S 19/13* (2010.01)
*H05K 7/10* (2006.01)

(56) References Cited

U.S. PATENT DOCUMENTS

| | | | | |
|---|---|---|---|---|
| 4,902,235 A * | 2/1990 | Tonooka | ............... | H05K 7/1038 29/876 |
| 5,002,493 A * | 3/1991 | Brown | ................ | H05K 7/1428 29/848 |
| 5,107,329 A * | 4/1992 | Okinaga | ............... | H01L 23/057 257/698 |
| 5,831,832 A * | 11/1998 | Gillette | ................... | H01L 23/13 257/737 |
| 7,134,882 B2 * | 11/2006 | Iida | ....................... | H01R 13/66 439/70 |
| 7,762,819 B2 * | 7/2010 | Mori | ...................... | H05K 1/144 439/66 |
| 8,500,459 B2 * | 8/2013 | Niitsu | .................... | H01R 23/68 439/74 |
| 8,834,183 B2 * | 9/2014 | Komoto | ................. | H01R 12/71 439/507 |
| 8,882,544 B2 * | 11/2014 | Komoto | ................. | H01R 13/46 439/626 |
| 2003/0163282 A1 | 8/2003 | Krieg et al. | | |
| 2011/0083889 A1 * | 4/2011 | Niitsu et al. | .................. | 174/258 |
| 2014/0336930 A1 * | 11/2014 | Thomas | ................ | G01C 21/165 701/472 |

OTHER PUBLICATIONS

Search Report dated May 14, 2012 in GB Application No. GB1120981.4.

* cited by examiner

ELECTRONIC DEVICE COMPRISING A MOULDED INTERCONNECT DEVICE

CROSS-REFERENCE TO RELATED APPLICATIONS

This application is U.S. national phase filing under 35 U.S.C. §371 of PCT/GB2012/052944 filed on Nov. 29, 2012, and claims priority from United Kingdom Application No. GB 1120981.4 which was filed on Dec. 7, 2011, both of which are incorporated herein by reference.

This invention relates to an electronic device, and in particular to a device in which there is a need to accommodate a large quantity of components into a small volume, and so the device is packaged with high density.

In many electronic device applications it is necessary to provide a high degree of functionality in the minimum possible volume. A key aspect in achieving compact multi-functional electronic devices is how to package and interconnect a large number of electronic components in a small volume. In many applications, the orientation and position of specific components is critical. One example is when the components are transducers, for example in medical applications. The relative positions of components may further be significant, for example to ensure that sensitive analog components are shielded from high speed digital components. In many applications it is further necessary that components are supported in a manner that is robust, for example that is capable of withstanding shock loads such as those arising from collisions (for example those that may arise in automotive contexts or due to dropping the device onto a hard surface).

One example of an electronic device application that includes all the requirements set out above is in navigation systems. In such applications it is necessary to track the location or movement of an object relative to an inertial reference frame.

Inertial navigation is one method by which this may be achieved, in which the change in position of an object is tracked by updating a known starting position and velocity based on measured accelerations of the object in the inertial frame. In strapdown inertial measurement the accelerometers rotate with the body of the object, and it is therefore necessary to measure the rotation of the object in addition to the accelerations in the body frame, to allow the measured accelerations in the frame of the body to be translated by a processor into position in the reference (or inertial) frame. The processor calculates updated position estimates in the reference frame based on the measured accelerations in the body frame and the measured rates of rotation.

A strapdown inertial measurement unit (IMU) typically includes an accelerometer and gyroscope aligned with each of three mutually orthogonal axes. Recent developments in micro electromechanical systems (MEMS) has resulted in highly miniaturised accelerometers and gyroscopes with constantly improving performance. Digital electronics are often used in the readout and control of MEMS sensors, for example providing closed loop control of primary drive signals in gyroscopes. MEMS sensors are still not sufficiently accurate to enable accurate tracking of an object over long durations without some form of correction.

A further method of navigation is to use a satellite positioning system (e.g. GPS, GLONASS, Galileo), in which precise timing signals from orbiting satellites are used to calculate a position in a reference frame. GPS (and other similar systems) suffers from at least two major problems: the delay in acquiring signals from sufficient satellites to obtain a position, and lack of availability due to signal attenuation (for example in urban canyons) or jamming. Both of these problems can be mitigated by the combination of an inertial measurement unit with a GPS receiver. The data from each system can be used to improve the accuracy of the other, and the IMU can compensate for GPS drop outs. A system with a combination of GPS and inertial measurement may be termed an integrated navigation system. The combination of GPS and inertial measurements is typically carried out using a processor.

A demand exists to implement ever more accurate location tracking systems in smaller and smaller volumes. The volume in such applications is often strictly limited by system constraints.

One of the major challenges in miniaturising both integrated navigation systems and inertial measurement units is in arranging the various components of the system so that they are properly aligned, supported and electrically connected. Typically there is a need to partition sensitive analogue electronics (for example the GPS receiver) from electrically noisy digital electronics (for example the processor). Furthermore, the resulting assembly may be required to be robust in harsh environments, for example under challenging industrial standards for climatic conditions, shock and vibration. Potting may be used to improve the robustness of assemblies which are to be subject to high levels of acceleration.

Prior art arrangements for inertial navigation units comprise a stack of planar circuit boards, with electrical connections between boards made by pins, pin headers and flexi-connectors (comprising a ribbon of conducting elements). Mechanical spacers would typically be used to separate and mechanically support the boards (prior to potting which may be necessary for very high g applications). Pins and flexi-connectors consume board area, and the large number of separate components used to mechanically and electrically connect the circuit boards necessitates the use of tooling to assist in assembly.

As is clear from the forgoing, a need exists to reduce the number of parts used in electronic devices with high density packaging requirements, thereby enabling improvements in miniaturisation, reliability and cost of such devices.

According to the present invention, there is provided an electronic device comprising a circuit substrate, and a moulded interconnect device incorporating integral legs to mount the interconnect device upon the substrate, the legs spacing at least part of the interconnect device from the substrate, at least one of the legs carrying a conducting track to provide an electrical interconnection between the interconnect device and the substrate.

It will be appreciated that the provision of legs integrally formed with the interconnect device and carrying the electrical connections enables efficient high density packaging in a simple and convenient manner.

The moulded interconnect device conveniently further comprises alignment features to ensure correct alignment between the interconnect device and the circuit substrate. The alignment features may comprise protrusions and/or recesses or through holes. Such features assist in simplifying assembly.

The conducting track may be formed integrally with the interconnect device.

The electronic device may further comprise an electromagnetic shield carried by the interconnect device.

The substrate may comprise a second moulded interconnect device which, in turn may be mounted upon and electrically connected to a further substrate by legs formed integrally with the second interconnect device and carrying conductive tracks. Such an arrangement permits manufacture of relatively complex devices in a relatively simple, convenient and compact manner.

The electronic device may comprise a navigation unit which includes an inertial sensor unit carried by the interconnect device and a GPS receiver and/or a processor carried by the substrate.

The invention will further be described, by way of example, with reference to the accompanying drawings in which.

Figure 1:
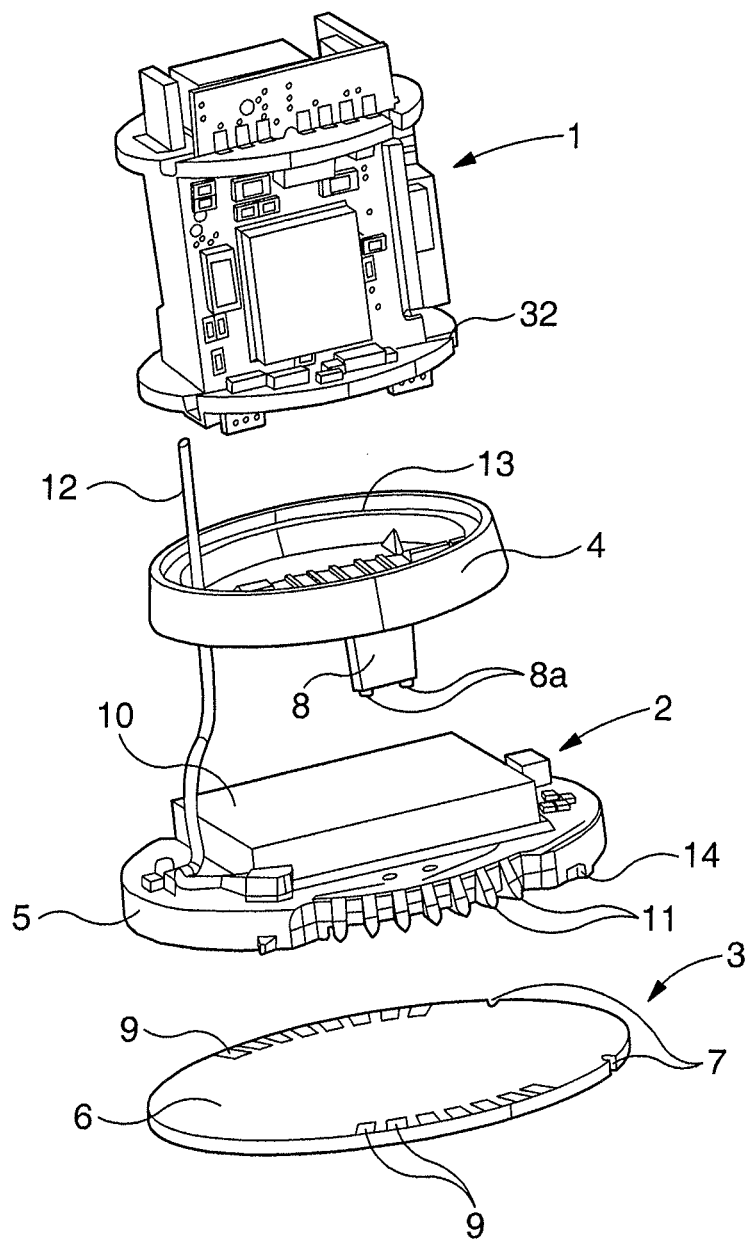
FIG. 1 is an exploded diagram of an integrated navigation system according to an embodiment of the invention.

In FIG. 1, an inertial navigation system is shown, comprising an inertial sensor unit 1, a GPS receiver 2 and a processor 3.

The inertial sensor unit 1 comprises three mutually orthogonal accelerometers and gyroscopes and is assembled from a number of separate circuit boards which slot together. Connections are made between the circuit boards comprising the inertial sensor unit 1 by solder connections between pads of the boards that are adjacent when assembled. The specific form of the inertial sensor unit 1 is not of relevance to the invention and so will not be described in further detail.

A moulded interconnect device 4 (described in greater detail below) is provided between the inertial sensor unit 1 and the GPS receiver 2. The GPS receiver 2 includes a circuit substrate which comprises another moulded interconnect device 5. Moulded interconnect devices may be formed from a moulded part, for example in the form of a plastics material which incorporates a metallic additive that can be activated subsequent to moulding to form conductive metal tracking on the surface of the moulded part. Activation may be achieved by laser activation. An alternative method by which moulded interconnect devices may be formed is by forming a moulded plastics part on which tracks may be formed. For example, the moulded plastics part could be formed from two plastics materials, one of which may be plated to form the tracks.

Moulded non-planar substrates for use as circuit boards are known, and the technology has, for instance, previously been applied to form cellphone antenna which are integrated with a plastics casing of a device. The technology allows conducting tracks to be formed on non-planar surfaces of a plastics material moulded part with a considerable degree of design freedom. Although moulded interconnects forming complex non-planar substrates are known, the use of a moulded interconnect device to both provide mechanical spacing and to make electrical connections using integral conducting tracks between stacked circuit substrates is a new approach in high density packaging.

Figure 2A:
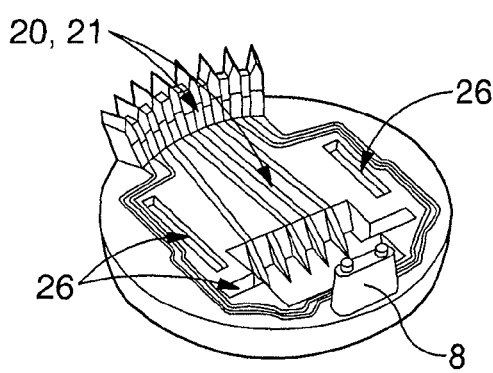
FIGS. 2a, 2b and 2c are views illustrating a moulded interconnect device located, in use, between an inertial measurement unit and a GPS receiver of the system of FIG. 1, from different angles.
Figure 2B:
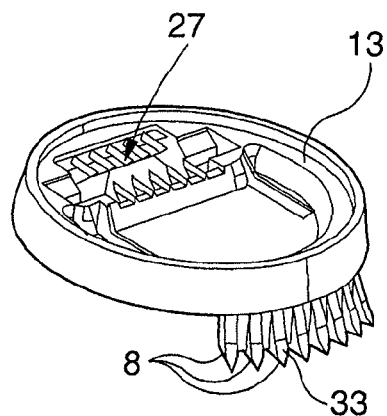
Figure 2C:
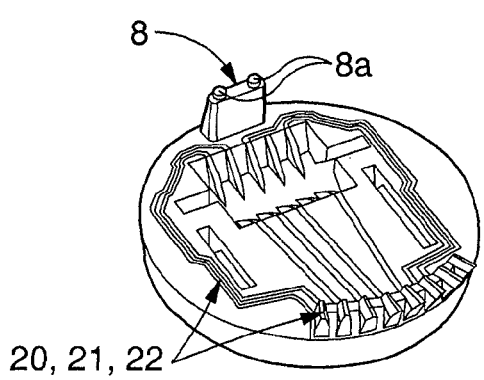

The moulded interconnect device 4 between the inertial sensor unit 1 and the GPS receiver 2 is shown in more detail in FIGS. 2a to 2c, and comprises a shoulder feature 13, integral mounting legs 8 upon some of which are provided alignment features 8a, alignment slots 26, through connections 27 and conductive tracking 20, 21, 22. FIGS. 2a and 2c show the moulded interconnect 4 from the side adjacent to the GPS receiver 2, and FIG. 2b shows the interconnect 4 from the side adjacent to the inertial sensor unit 1.

The moulded interconnect device 4 provides support for the inertial sensor unit 1, and provides electrical connections between the inertial sensor unit 1 and the GPS receiver 2. Conductive metal tracking 20, 21, 22 is formed, in this case, primarily on the surface of the interconnect device 4 remote from the inertial sensor unit 1, and comprises generally planar tracks 20, sloping tracks 21 extending over parts of some of the legs 8, and solderable metallisation 22, again provided on some of the legs 8. An array of electrical connections are made to the lower circuit board 32 of the inertial sensor unit 1 by the connection features 27. The connection features 27 are disposed around the edges of a through hole in the moulded interconnect device 4, and comprise sloping features which end adjacent to the lower circuit board 32 of the inertial sensor unit 1 when assembled.

The through hole is substantially rectangular, and the connection features 27 are arranged protruding from the two long sides of the through hole. The connection features 27 comprise further metal tracks provided on a sloping feature of the connection features 27, and solderable metallisation at the tip of the features 27, adjacent to the inertial sensor 1 when assembled. The slope of the sloping feature of the connections 27 is substantially 45 degrees, and the sidewalls of the through hole are sloped more steeply than 45 degrees or are substantially vertical.

The connection features 27 may be electrically connected to the inertial sensor unit 1 by soldering between the solderable metallisation and corresponding solderable metal pads on the lower circuit board 32 of the inertial sensor unit 1. The tips of the connection features 27 are chamfered to create an edge which, when assembled, makes contact substantially in the centre of the corresponding solderable metal pad. It will be appreciated that any suitable soldering technique may be used.

Further connection features 33 are provided at the edge of the moulded interconnect device, comprising some of legs 8, in this case of sloping form, provided with metal tracking 21, and solderable metallisation 22. The features 33 are arranged to extend to the surface of the GPS receiver when assembled. Solder connections may subsequently be made between the connection features 33 and corresponding solderable pads 28 on the GPS receiver 2. The solder connections may be achieved using any suitable soldering technique. For example, a wave or flow soldering technique may be used, if desired. Tracking 20 extends between the connection features 27 and respective connection features 33, thereby connecting solder pads of the inertial sensor unit 1 with corresponding solder pads 28 of the circuit substrate 5 of the GPS receiver 2 when assembled.

The shoulder feature 13 provides support for the inertial sensor unit 1 when assembled, and corresponds with the lower circuit board 32 thereof. When assembled, the lower circuit board 32 sits within the lip defined by the shoulder feature 13. Slots 26 are further provided which assist in properly aligning the inertial sensor unit 1 with the moulded interconnect 4. As the skilled person will appreciate, the proper alignment of the inertial sensor unit 1 relative to the body of the object in which it is installed is important in achieving the highest level of accuracy in navigation and in minimising calibration operations. The provision of slots 26 and the shoulder feature 13 ensure that the reference alignment between the inertial sensor unit 1 and the moulded interconnect 4 is maintained without the requirement for any jigs or complex assembly arrangements. The moulded interconnect 4 is aligned with the GPS receiver 2 by two pegs 8a which mate with corresponding through holes 31 in the circuit substrate 5 of the GPS receiver 2. The pegs 8a extend from a face of one of the legs 8 which extends from the planar surface of the moulded interconnect device 4 to the circuit substrate 5 of the GPS receiver 2 when assembled. When assembled, mechanical contact is made between the planar surface of the circuit substrate 5 of the GPS receiver 2 and the connection features 33 and face of the leg 8 which carries the pegs 8a. The alignment and the gap between the moulded interconnect 4, inertial sensor unit 1 and the GPS receiver 2 is thereby maintained.

The legs 8 of the moulded interconnect device 4 replace mechanical spacers, pin headers and flex-connectors which would otherwise be necessary to provide mechanical registration and support and to make electrical connections between the inertial sensor unit 1 and the GPS receiver 2. This saves on both the cost of these parts, improves the ease of assembly and provides improved mechanical alignment between the inertial sensor unit 1 and the other components of the inertial navigation system. The invention thus provides an arrangement of relatively simple and convenient form, enabling high density packaging of components, and providing a good mechanical mounting of one substrate upon another whilst also providing the required electrical connections therebetween.

Figure 3A:
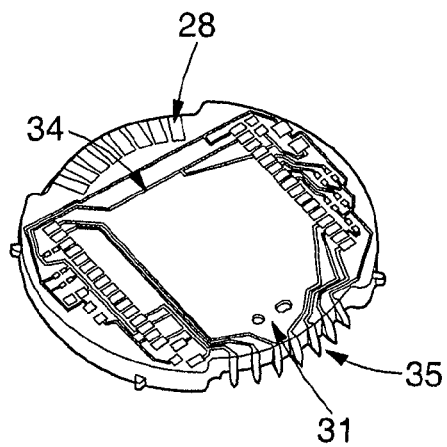
FIGS. 3a, 3b and 3c are views illustrating a second moulded interconnect device located, in use, between the GPS receiver and a processor of the system of FIG. 1, from different angles.
Figure 3B:
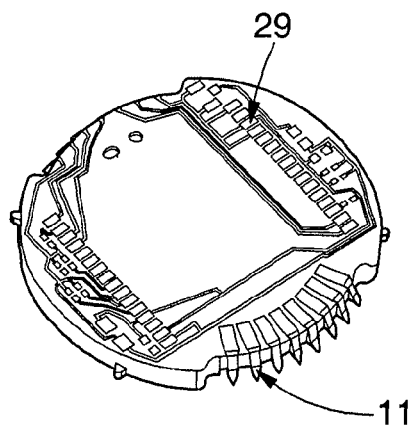
Figure 3C:
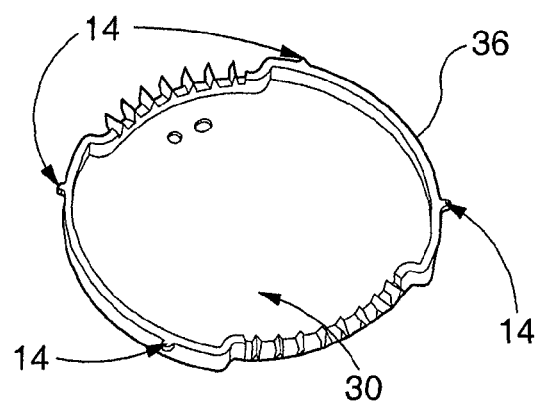
Figure 4:
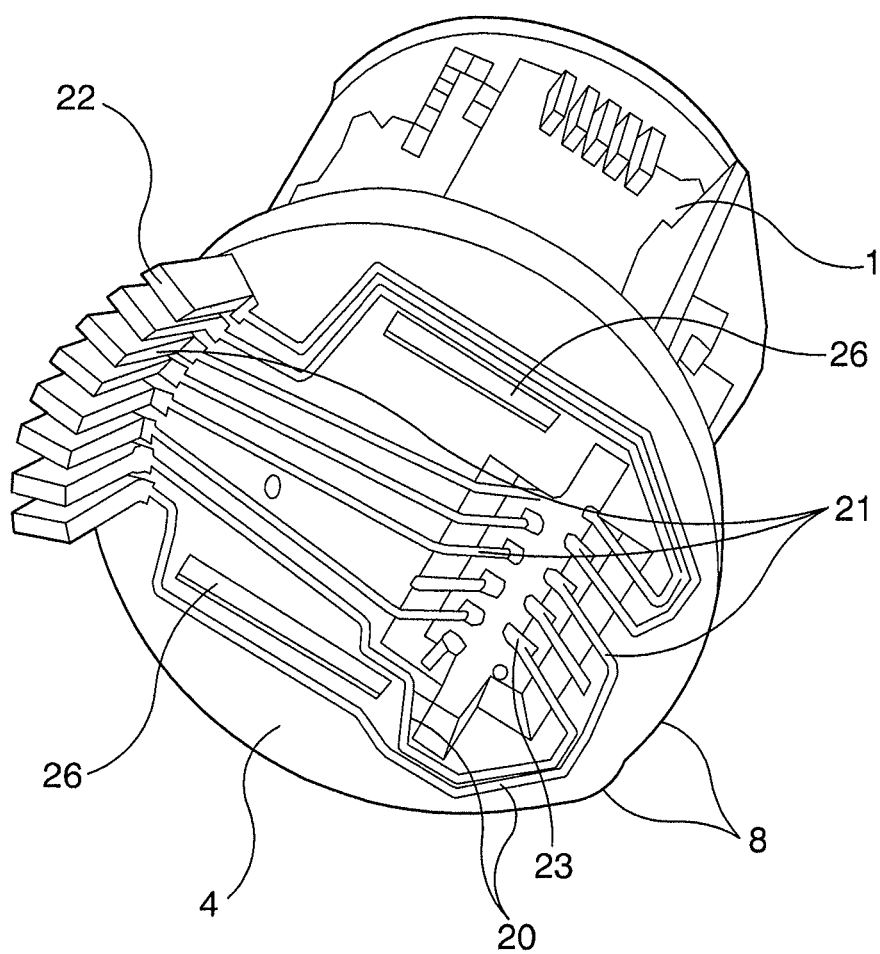
FIG. 4 illustrates the inertial measurement unit connected to the moulded interconnect device.
Figure 5:
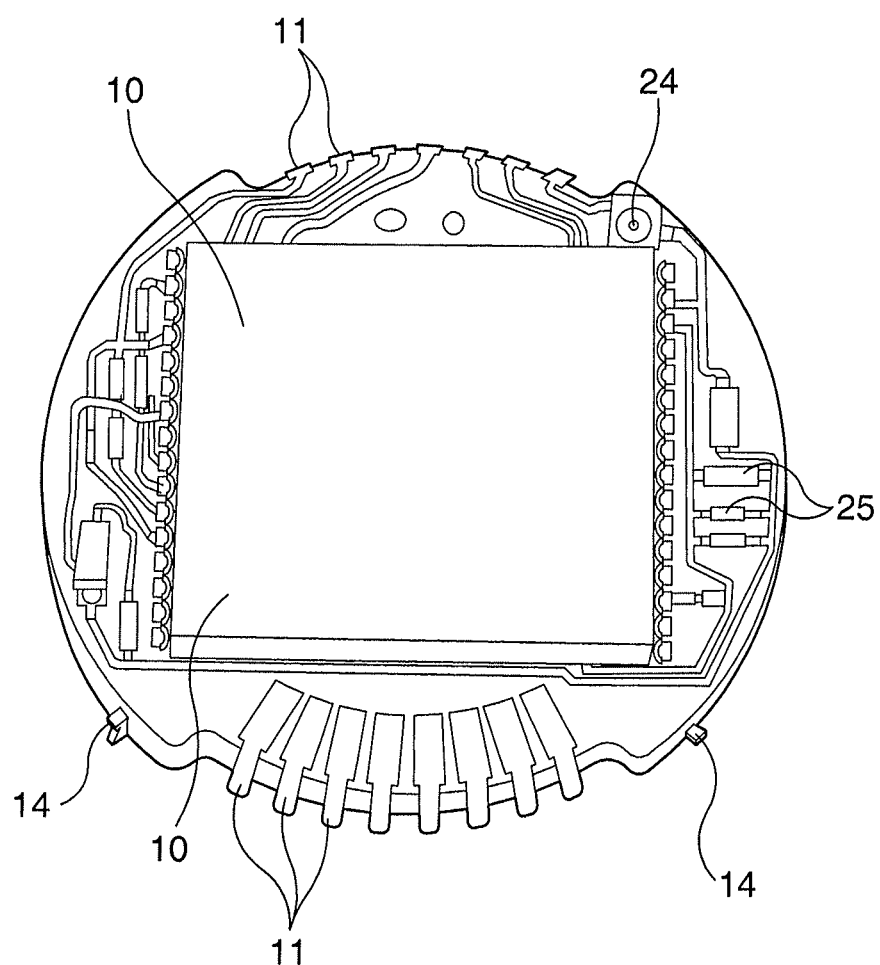
FIG. 5 illustrates the GPS receiver, the circuit substrate of which comprises the second moulded interconnect device.

The GPS receiver 2 comprises a circuit substrate 5 on which is carried a GPS receiver module 10 and a number of other passive components. The GPS receiver module may be a high rate, high precision GPS module capable of very fast acquisition and operation with low signal strength. The circuit substrate 5 comprises a substantially planar first side (shown in FIGS. 3a and 3b), on which the GPS receiver module 10 and a number of associated electrical components are carried, and a second side (shown in FIG. 3c) on which an electromagnetic shield 30 is disposed. A connector for the feed 12 from the GPS antenna (not shown) is further provided.

The circuit substrate 5 comprises a moulded interconnect device which is provided with connection features 11 (similar to the connection features 33 of the moulded interconnect device between the inertial sensor unit 1 and the GPS receiver 2) which carry electrical connections directly from the solderable pads 28 through the thickness of the circuit substrate 5 to the underlying processor circuit board 6.

The planar surface of the GPS circuit substrate 5 is compatible with standard surface mount technologies. It may thereby be screen printed with solder, populated with electronic components and the solder reflowed in the manner known to the skilled person.

The GPS receiver module 10 is sensitive to radio frequency interference, and an electromagnetic shield 30 is therefore provided on the second side of the circuit substrate 5. The electromagnetic shield 30 comprises a conducting planar layer which extends to cover substantially the whole of the circuit substrate 5, with the exception of the electrical through connections 11, 35 and a circumferential lip 36 which protrudes axially. An electrical connection may be provided to electrically ground the electromagnetic shield 30.

Solderable pads 29 are provided on the first side of circuit substrate 5 by which the GPS receiver module 10 may be electrically connected to the substrate 5. Conductive tracking 34 is provided on the circuit substrate 5 and arranged to make electrical connections between the GPS receiver module 10, the associated electrical components carried on the substrate 5, the GPS antenna feed 12 and the connection features 35. The connection features 35 carry the connections from the first side to the second side of the substrate 5.

A circumferential lip 36 which protrudes axially is provided on the second side of the substrate 5 around the perimeter of the electromagnetic shield 30. The lip 36 defines the gap between the surface of the circuit substrate 6 of the processor 3 and the electromagnetic shield 30. The gap thereby provided may accommodate electrical components disposed on the facing side of the processor substrate 6 when assembled. Alignment features 14 that protrude both radially and axially are provided on the lip 36 which cooperate with corresponding recesses 7 of the processor substrate 6 and with features of the packaging (not shown) in which the inertial navigation unit may be packaged.

The processor substrate 6 may comprise a high speed digital processor. The processor may implement algorithms that provide position estimates based on the combined GPS and inertial sensor data. Kalman filters, for instance to minimise error, may be implemented by the processor 3, as are known to the skilled person. The processor substrate 6 may be populated with electrical components on either side, or both. Further electrical components may be provided on the processor substrate 6, for example for power supply and communication.

The processor and GPS substrates 5, 6 may be less than 45 mm in external diameter. As is clear from FIG. 1, the components of the inertial navigation system conform to a circular external profile which, when assembled, tapers from the processor 3 to the inertial sensor unit 1. A GPS antenna may be provided at the tip of the narrow end of the stack. Alternative arrangements of inertial navigation system with a different external profile may be more suitable, depending on the application. Such alternative arrangements are contemplated by the inventors as within the scope of the invention.

Although the embodiment described hereinbefore has described an arrangement in which the processor is carried on a separate circuit substrate, an arrangement in which all or part of one or more of the inertial sensor unit, GPS receiver and processor are carried on the same circuit substrate is contemplated as within the scope of the invention.

As is clear from the forgoing description, the use of moulded interconnect devices in an inertial navigation system helps eliminate many parts that would otherwise be needed, thereby saving cost, volume and mass. The use of such technology enables a design with very high density packaging suitable for applications which are highly constrained by volume or mass.

Although the foregoing has used a navigation unit as an example of an electronic device that requires high density packaging and is further subject to a range of specific challenges (robustness, accuracy in assembly etc), the invention is not so limited. Electronic devices according to the invention may for example comprise mobile phones, medical devices and miniature personal computers (e.g. tablets). It will be understood, therefore, that a wide range of modifications and alterations may be made to the arrangement described hereinbefore without departing from the scope of the invention.

What is claimed is:

1. An electronic device comprising a circuit substrate, an inertial sensor unit, and a moulded interconnect device carrying the inertial sensor unit, the interconnect device being moulded from a plastics material and incorporating integral legs to mount the interconnect device upon the substrate, the legs spacing at least part of the interconnect device from the substrate, at least one of the legs carrying a conducting track to provide a substantially direct electrical interconnection between the interconnect device and the substrate, wherein the conducting track is formed integrally with the interconnect device, and wherein the conducting track comprises a sloping track extending over part of the at least one of the legs.

2. The electronic device of claim 1, wherein the moulded interconnect device further comprises alignment features to ensure correct alignment between the interconnect device and the circuit substrate.

3. The electronic device of claim 2, wherein the alignment features comprise protrusions and/or recesses or through holes.

4. The electronic device of claim 1, further comprising an electromagnetic shield carried by the interconnect device.

5. The electronic device of claim 1, wherein the substrate comprises a second moulded interconnect device.

6. The electronic device of claim 1, wherein the device comprises a navigation unit which includes an inertial sensor unit carried by the interconnect device and a GPS receiver and/or a processor carried by the substrate.

7. The electronic device of claim 1, wherein the plastics material includes a metal additive, activation of which, after moulding, results in the formation of conductive metal tracking on the surface of the moulded interconnect device.

* * * * *